US006785529B2

(12) United States Patent
Ciccarelli et al.

(10) Patent No.: US 6,785,529 B2
(45) Date of Patent: Aug. 31, 2004

(54) SYSTEM AND METHOD FOR I-Q MISMATCH COMPENSATION IN A LOW IF OR ZERO IF RECEIVER

(75) Inventors: Steven C. Ciccarelli, Encinitas, CA (US); Arun Raghupathy, San Diego, CA (US); Robert Reeves, Escondido, CA (US)

(73) Assignee: Qualcomm Incorporated, San Diego, CA (US)

( * ) Notice: Subject to any disclaimer, the term of this patent is extended or adjusted under 35 U.S.C. 154(b) by 121 days.

(21) Appl. No.: 10/157,259

(22) Filed: May 29, 2002

(65) Prior Publication Data

US 2003/0139167 A1 Jul. 24, 2003

Related U.S. Application Data

(60) Provisional application No. 60/351,664, filed on Jan. 24, 2002.

(51) Int. Cl.[7] .................................................. H04B 1/00
(52) U.S. Cl. ........................ 455/324; 455/323; 455/296; 455/302
(58) Field of Search ................................ 455/324, 296, 455/302, 323, 550.1, 553.1, 114.2, 115.3, 134, 135, 141, 214, 226.1, 226.2, 255, 278.1; 375/346, 350, 298, 261; 370/260, 335, 342

(56) References Cited

U.S. PATENT DOCUMENTS

| | | | |
|---|---|---|---|
| 5,705,949 A | | 1/1998 | Alelyunas et al. .......... 329/304 |
| 5,826,180 A | | 10/1998 | Golan et al. ................. 455/302 |
| 5,828,955 A | * | 10/1998 | Lipowski et al. ........... 455/324 |
| 6,161,004 A | * | 12/2000 | Galal et al. .................. 455/302 |

FOREIGN PATENT DOCUMENTS

| | | | |
|---|---|---|---|
| GB | 2348345 | 9/2003 | ......... H04L/27/227 |
| WO | 9708842 | 3/1997 | ............ H04B/1/26 |
| WO | 9832221 | 7/1998 | ............ H03D/7/16 |

OTHER PUBLICATIONS

Glas, J. (1998) Digital I/Q Imbalance Compensation in a Low–IF Receiver; IEEE pp. 1461–1466.

F. Aschwanden: "Direct Conversion How To Make It Work In TV Tuners", IEEE Transactions On Consumer Electronics, vol. 42, No. 3, Aug. 1, 1996, pp. 729–738, XP000638561, New York, US.

* cited by examiner

*Primary Examiner*—Tony T. Nguyen
(74) *Attorney, Agent, or Firm*—Philip Wadsworth; Charles D. Brown; Howard H. Sao

(57) ABSTRACT

A compensation circuit to correct for mismatch in a quadrature receiver comprises first and second mixers to receive a radio frequency (RF) modulated signal. One mixer receives an I local oscillator signal while the second mixer receives a Q local oscillator signal wherein the I and Q local oscillators have frequencies that are substantially identical. The output of the first and second mixers are coupled to first and second filters, respectively, which generate the I and Q output signals, respectively. Inherent circuit mismatch generate gain and/or phase errors that result in mismatch in the I and Q output signals. A correction circuit automatically applies a correction factor to at least one of the I and Q output signals to correct the gain and/or phase error by applying a multiplication factor to at least one of the I and Q output signals to thereby generate a corrected signal. The correction factors must be determined on a unit by unit basis. Testing in the final stages of factory assembly may be used to determine the value of the correction factor. The correction factor may be stored in a memory of the wireless communication device and used thereafter.

31 Claims, 9 Drawing Sheets

SYSTEM AND METHOD FOR I-Q MISMATCH COMPENSATION IN A LOW IF OR ZERO IF RECEIVER

RELATED APPLICATIONS

This application claims priority to U.S. Provisional Application No. 60/351,664 filed Jan. 24, 2002.

BACKGROUND

1. Technical Field

The disclosed system and method generally relates to the field of wireless communications. More particularly, the disclosed system and method relates to a system and method for compensating for I-Q mismatch in a low intermediate frequency (IF) or zero IF receiver.

2. Description of Related Art

Radio receivers, such as a heterodyne receiver, have long been used for radio communication. With a heterodyne architecture, a radio frequency signal is detected by a tuner, or other radio frequency device coupled to an antenna. An internal oscillator, called a local oscillator, is supplied to a mixer along with the radio frequency signal. The mixer produces output signals at both the sum and difference between the radio frequency and the local oscillator. The output of this stage is usually designated as an intermediate frequency (IF). Because the IF is still relatively high frequency, conventional filtering techniques may be used to eliminate one set of output signals from the mixer (i.e., either the sum or the difference signals).

Heterodyne techniques have been used in many kinds of receivers. For example, wireless communication devices, such as cellular telephones, often use heterodyne architecture. However, this architecture requires additional circuitry, power consumption and additional expense to build the device. Thus, new system architectures are arising in which the IF circuitry is eliminated. Receivers employing this architecture are sometimes referred to as zero IF receivers. In this application, the local oscillator mixes the radio frequency signal directly to baseband frequencies. In a similar architecture, designated as a low IF architecture, the local oscillator mixes the RF signal down to an IF. However, the IF is a very low frequency and thus does not permit the conventional filtering to remove the undesirable image band interference as is common in heterodyne architectures, as described above.

The zero IF and low IF receivers have virtually identical front end circuitry. An example of this system architecture is illustrated in FIG. 1 in which a quadrature receiver employs zero IF or low IF architecture. As illustrated in FIG. 1, a conventional system 10 includes an antenna 12 coupled to a radio frequency (RF) stage 14. The RF stage 14 may include amplifiers, filters, tuning elements, and the like. Details of the RF stage 14 are known to those skilled in the art and need not be described herein. The RF stage 14 operates in conjunction with the antenna 12 to detect a modulated RF signal and generates an electrical signal corresponding thereto.

The conventional system 10 also includes an RF splitter 16, which generates two identical copies of the signal from the output of the RF stage 14. The RF splitter 16 may be an electrical circuit or, in its simplest implementation, it may simply be a wire connection. In some implementations, the RF splitter 16 may be implemented as part of the RF stage 14.

The two identical signals are provided to RF inputs of a mixer 20 and a mixer 22. The mixers 20 and 22 each include a local oscillator input. The mixer 20 is provided with the local oscillator signal, designated as an "I" local oscillator. The mixer 22 is provided with a local oscillator signal, designated as a "Q" local oscillator. The local oscillator signals I and Q are identical in frequency, but have a 90° phase shift with respect to each other. Techniques for producing these quadrature signals are known in the art and need not be described in detail herein. The output of the mixers 20 and 22 are provided to low-pass filters 24 and 26, respectively. In an exemplary embodiment, the filters 24 and 26 are low-pass filters. The resultant signal generated by the filter 24 is a baseband (or near baseband) signal I(t). Similarly, the resultant signal generated by the filter 26 is a baseband (or near baseband) signal Q(t).

In ideal circumstances, the quadrature signals provided by the I local oscillator and the Q local oscillator are separated by precisely 90°. The resulting I and Q outputs would, ideally, have equal amplitudes. Further, an ideal system would have precisely matched mixers 20 and 22 and matched filters 24 and 26. Under these ideal circumstances, the output I(t) and Q(t) are truly orthogonal. That is, there is no projection of the I(t) signal into the Q(t) signal and vice-versa.

Unfortunately, such ideal circuits do not exist. Even with close matching of the mixers 20 and 22 and the filters 24 and 26, some phase and/or gain errors will result. This undesirable circuit mismatch in the I and Q circuits results in output signals I(t) and Q(t) that are not truly orthogonal. That is, the I(t) signal may project onto the Q(t) signal and vice-versa. The results of this circuit mismatch are illustrated in FIGS. 2A and 2B. The results of circuit mismatch affect both I(t) and Q(t); thus, we will consider the complex spectrum of the quadrature signals in the discussion with respect to FIGS. 2A and 2B.

FIG. 2A is an RF spectrum. Those skilled in the art will recognize that, for the sake of convenience, the RF spectrum is not drawn to scale. The RF spectrum includes a line 30 representing the I local oscillator signal. The desirable signal is indicated by a portion 32 of the spectrum. FIG. 2A also illustrates what are designated as "jammer" signals that are present due to adjacent channels or alternate channels. The adjacent channel, separated from the carrier frequency of the desired signal by 30 kilohertz (kHz), is indicated by a portion 34 of the spectrum labeled as the J_30 signal.

Telecommunications standard IS-98B, entitled "RF Performance for Dual-Mode Mobile Telephones," specifies the measurement of certain interference signals using a jammer signal that is separated from the desired carrier frequency by 60 kHz. A portion 36 of the spectrum indicates the presence of the J-60 jammer signal. In addition, FIG. 2A illustrates a portion 38 of the spectrum resulting from a jammer signal J_120, which is separated from the carrier frequency of the desired signal 32 by 120 kHz.

Those skilled in the art will appreciate that the spectrum is symmetrical about the DC axis (0 Hz). Thus, the spectrum 32 of the desired signal has a mirror image spectrum 32', which is centered at the minus carrier frequency. Similarly, the spectrum 34, 36, and 38 each have mirror image spectra 34', 36', and 38', respectively.

FIG. 2A also illustrates a line 40 indicating a portion of the spectrum resulting from a local oscillator signal due to mismatch between the I and Q portions of the circuit illustrated in the example circuit of FIG. 1. The mixers 20 and 22 multiply the signals in the RF spectrum by the value of the local oscillator 30. The result of processing the portions 32–38 and 32'–38' by the local oscillator 30 is effectively a shift in frequency of all components in the spectrum of FIG. 2A. Following processing by the mixers (e.g., the mixer 20) and the filters (e.g., the filter 24), the I circuit of FIG. 1 produces the baseband spectrum illustrated in FIG. 2B. The spectral portions 32–38 and 32'–38' have effectively been shifted to the right by the frequency of the local oscillator. As a result, the portion 32' of the spectrum, which represents the desired signal, is now centered at 15 kHz. Similarly, the portions 34', 36', and 38' of the spectrum have been frequency shifted and are now centered at −15 kHz, −45 kHz, and −105 kHz, respectively. At the same time, the portions 32–38 of the spectrum (see FIG. 2A) have been shifted to a much higher frequency level and are not illustrated in FIG. 2B. Those portions of the spectrum are undesirable and are readily removed using conventional techniques.

The mismatch local oscillator 40 also interacts with the portions 32–38 and 32'–38' of the RF spectrum illustrated in FIG. 2A. While the positive frequency value of the local oscillator 30 effectively shifts the RF spectrum in the positive frequency direction, the negative frequency value of the mismatched local oscillator 40 effectively shifts the RF spectrum in the negative frequency direction. As a result, the portions 32'–38' are shifted in the negative frequency direction such that they cause no interference with the desired signal centered at 15 kHz in FIG. 2B. However, the portions 32–38 of the spectrum in FIG. 2A are shifted to the left such that the original portion 32 in FIG. 2A is now centered at −15 kHz and is identified in FIG. 2B as a portion 32$i$ to indicate that the portion 32$i$ is a signal image resulting from the undesirable presence of the mismatch local oscillator 40. Similarly, the portions 34–38 of the spectrum in FIG. 2A are shifted in the negative frequency direction to produce spectral portions 34$i$–38$i$ illustrated in FIG. 2B. It should be noted that the portion 34$i$ is the J__30 image spectrum, which effectively creates sidebands in the baseband signal directly coincides with the desired signal spectrum centered at 15 kHz. In addition, portion 36$i$, representing the J__60 image spectra, is centered at 45 kHz and may also cause significant interference with the desired signal.

The undesirable sidebands 32$i$–38$i$ may be characterized as "residual sidebands" because they result from the residual effects of the mismatch local oscillator 40. Careful matching of the circuit components for the mixers 20 and 22 and the filters 24 and 26 may reduce the residual sidebands and thus the undesirable image spectra. However, circuit matching cannot completely eliminate the mismatch local oscillator signal. Therefore, it can be appreciated that there is a significant need for a technique to compensate for I-Q mismatch in a zero IF or low IF system architecture. The present invention provides this and other advantages as will be apparent from the following detailed description and accompanying figures.

SUMMARY

The present invention is embodied in an apparatus for the compensation of I-Q mismatch in a low IF or zero IF receiver and comprises first and second mixers having respective radio frequency (RF) inputs, local oscillator inputs, and mixer outputs. The RF inputs of the mixers are configured to receive modulated RF signals, the local oscillator of the first mixer is configured to receive an I local oscillator signal while the local oscillator input of the second mixer is configured to receive a Q local oscillator signal. The I and Q oscillator signals have substantially identical frequencies. The apparatus further comprises first and second filters coupled to the mixer outputs of the first and second mixers, respectively, to filter output signals from the mixer outputs and thereby generate I and Q output signals, respectively. Circuit differences in the first and second mixers and/or first and second filters result in gain and/or phase errors that result in mismatch in the I and Q output signals. The apparatus comprises a correction circuit to automatically apply a correction factor to at least one of the I and Q output signals to correct the gain and/or phase error by applying a multiplication factor to the at least one of the I and Q output signals to thereby generate a corrected signal.

In an exemplary embodiment, the correction circuit applies multiplication factors to both the I and Q output signals to thereby generate a corrected I output signal and a corrected Q output signal. The compensation circuit may be an analog circuit or a digital circuit. In one embodiment, the receiver is a portion of a wireless communication device and the system further comprises a storage area to store data indicative of the correction factor.

In an exemplary embodiment, a test signal generation circuit generates a fixed frequency signal as inputs to the first and second mixers to permit the test measurement of gain and/or phase errors. In this embodiment, the correction factor applied by the correction circuit is based on the test measurement. The correction factors may be stored in a storage area within the wireless communication device with the data in the storage area indicative of the correction factor.

DETAILED DESCRIPTION OF THE EMBODIMENTS

The present invention provides active correction of the I(t) and Q(t) signals to overcome the inherent mismatch and the resultant detrimental effects. As will be described in greater detail below, each communication device is unique and, in an exemplary embodiment, undergoes calibration at the factory. The calibration factors are stored in the device and used to automatically generate the compensated signals.

Figure 1:
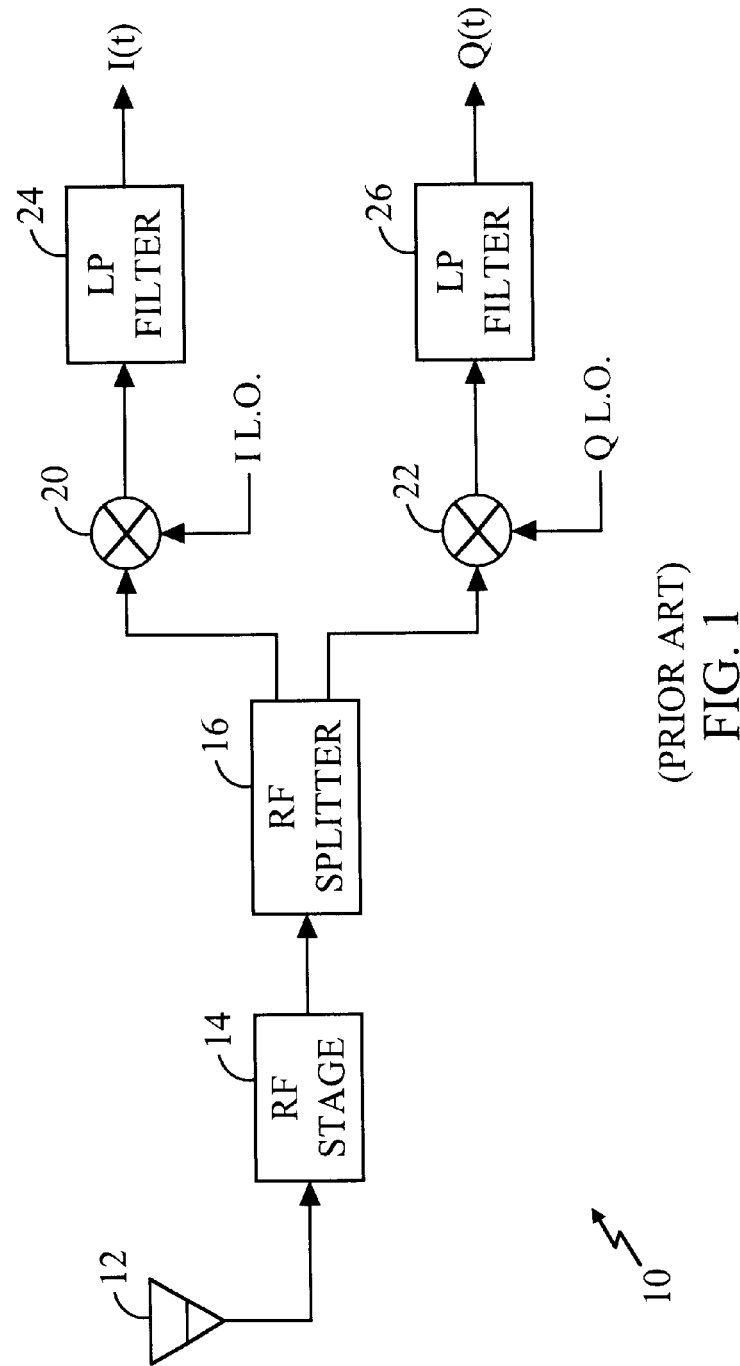
FIG. 1 is a functional block diagram of an RF receiver circuit known in the art.
Figure 3:
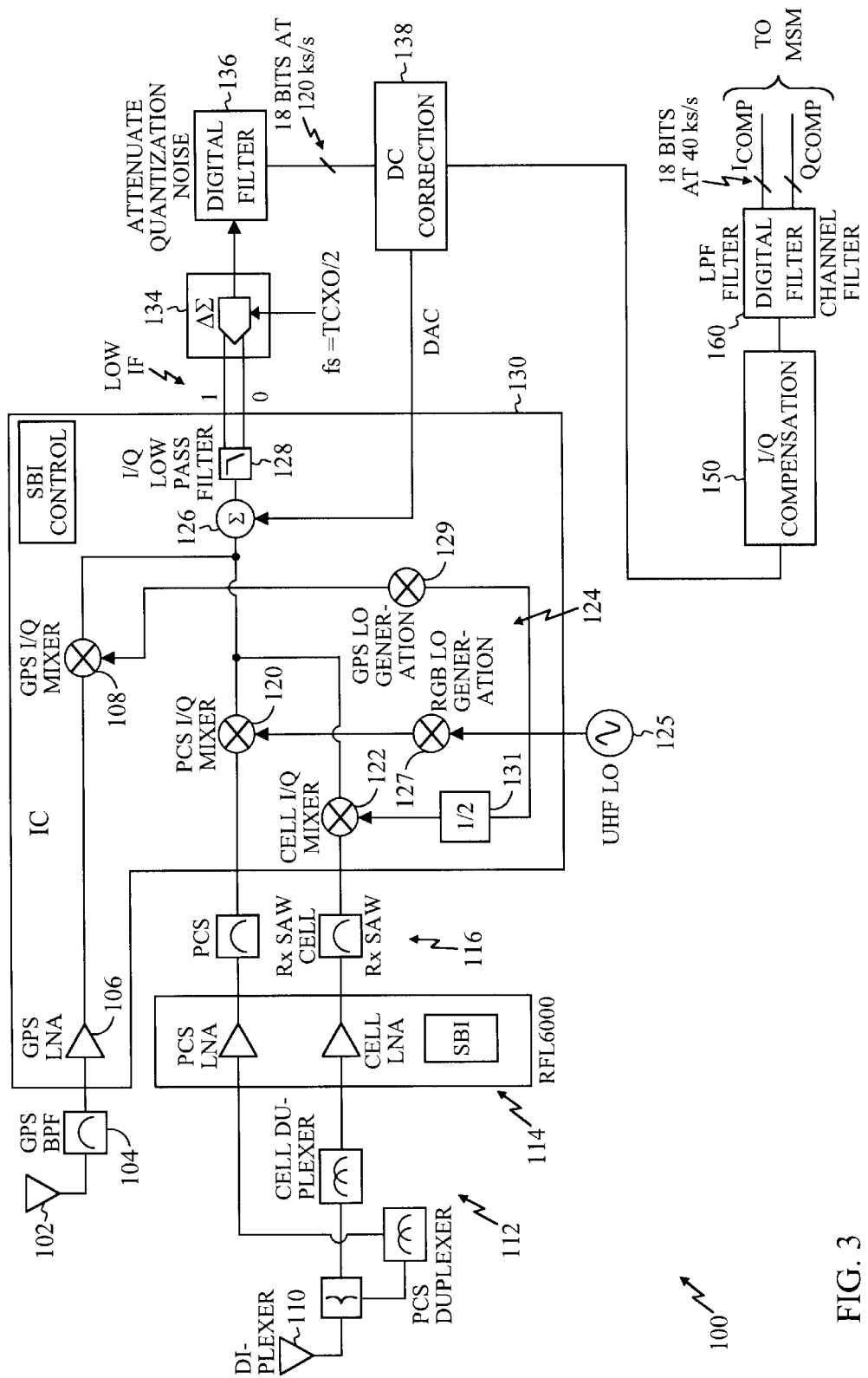
FIG. 3 is a functional block diagram of an implementation of the present invention.

In an exemplary embodiment, the present invention is embodied in a system 100 illustrated in the functional block diagram of FIG. 3. As can be seen by the block diagram of FIG. 3, the present invention is applicable to any quadrature receiver, such as an advanced mobile phone system (AMPS), a global positioning system (GPS) receiver, a conventional cell phone system, or a PCS system. The GPS embodiment may include a GPS antenna 102, a filter 104, an amplifier 106, and an I-Q mixer circuit 108. Those skilled in the art will recognize that the I-Q mixer circuit 108 illustrates a single mixer. However, there are separate mixers for the I signal and the Q signal, such as those illustrated in FIG. 1.

The wireless communication system also includes an antenna 110, antenna diplexers 112 to permit both transmission and reception on multiple bands, amplifiers 114, and filters 116. In one embodiment, the filters 116 are implemented as surface acoustic wave (SAW) filters. The operational frequencies of the components, such as the filters 116, will typically vary for the cell phone circuit and the PCS circuit. For example, cell phones typically operate in the 800 MHz frequency band while a PCS device may typically operate in the 1900 MHz frequency band.

The output of the filters 114 are provided to a PCS I-Q mixer 120 and a cell I-Q mixer 122. Again, those skilled in the art will recognize that the PCS I-Q mixer 120 and the cell I-Q mixer 122 actually comprise separate mixers for the I signal and the Q signal.

Also illustrated in FIG. 3 is a local oscillator circuit 124, which provides the necessary frequencies and quadrature signals (i.e., 90° phase shift) required by the mixers 108, 120, and 122. The local oscillator circuit 124 includes an ultrahigh frequency oscillator 125, the output of which is coupled to a PCS local oscillator generation mixer 127 to generate the necessary frequencies for local oscillator associated with a PCS wireless device. In addition, the output of the UHF oscillator 125 is coupled to a GPS local oscillator generation mixer 129 to generate the necessary frequencies for use with the GPS mixer 108. In addition, the output of the UHF oscillator 125 is coupled to a divider circuit 131 to generate the necessary frequencies for the cell phone mixer 122. Those skilled in the art will recognize that a number of different known techniques may be used to produce the necessary quadrature signals at the various frequencies required for GPS, PCS, and cell, respectively. For the sake of brevity, those details need not be included herein. Furthermore, those skilled in the art will recognize that the system 100 does not require multiple mixers (i.e., the GPS mixer 108, the PCS mixer 120, and the cell mixer 122) for satisfactory operation. Rather, the system 100 is applicable to the output of any quadrature mixer to correct imbalance between the I and Q circuits. Thus, the system 100 could be used satisfactorily with a GPS-only receiver, which would only require the GPS mixer 108. Furthermore, the system 100 could be readily applied to a PCS-only device or a cell-only device.

The signals from the various receiver portions are combined by an adder 126 and provided to I-Q low-pass filters 128. Although FIG. 3 illustrates only a single I-Q low-pass filter 128, separate I and Q filters are provided. The resultant output of the I-Q filters 128 are low IF signals I(t) and Q(t). In the example provided in the baseband spectrum of FIG. 2B, the RF signal is mixed down to a low IF of 15 kHz. In alternative embodiments, the RF signal may be mixed directly to a zero IF. Both zero IF and low IF architectures encounter the same difficulties in I-Q mismatch. The present invention is applicable to both zero IF and low IF architectures.

Some of the elements described above, such as mixers 108, 120 and 122, may be implemented in an integrated circuit (IC) 130 to provide close tolerance and better matching of components. The IC 130 uses known techniques to provide matching of circuit components (e.g., transistors) and temperature dependencies. However, even with close circuit tolerances provided by the IC 130, circuit mismatches are still present, which results in the undesirable interference from residual sidebands.

The signals are digitized by an A-to-D converter (ADC) 134. In an exemplary embodiment, the ADC 134 may be implemented by a Delta-Sigma converter, which is known in the art. The ADC 134 is followed by a digital filter 136 to attenuate quantization noise and a DC correction circuit 138, which provides feedback to the ADC 134. The operation of these elements is known in the art and need not be described in greater detail herein.

The system 100 also includes an I-Q compensation circuit 150 to generate compensated versions of the signals I(t) and Q(t). The following mathematical analysis is provided to gain an understanding of the signals provided by the I-Q compensation circuit 150.

Two jammer sources are driving forces behind the specification for the dynamic range of the components implemented in the IC 130. They are the 60 kHz jammer and its image. The 60 kHz jammer is removed, to a large extent, by conventional filtering. The filter 128 attenuates the 60 kHz jammer to approximately the same degree as would a typical IF filter in a conventional heterodyne architecture.

Any ghost local oscillator (e.g., the LO 40 in FIG. 2A), which may sometimes be referred to as a residual side band (RSB), will down convert the positive frequency component of the real input signal. The image of the 60 kHz jammer appears offset from the desired signal at 60−2×IF. Thus, in the baseband spectrum of FIG. 2B, the portion 36$i$ representing the image of the 60 kHz jammer (i.e., the J-60 image spectra) appears centered at 45 kHz for a 15 kHz low IF. The image suppression is thus a function of I-Q matching, as well as filtering, that is, the low-pass filters 128 and the digital fitter 136 may help to reduce the amplitude of the 60 kHz jammer. In addition, a digital filter 160 following the compensation circuit 150 may also help to reduce the amplitude of the 60 kHz jammer. The digital filter 160 generates signals $I_{comp}$ and $Q_{comp}$, which are compensated signals. These signals are processed by additional circuitry, such as a mobile station modem (not shown), in a conventional manner to produce an output signal (e.g., an audio signal).

Figure 2A:
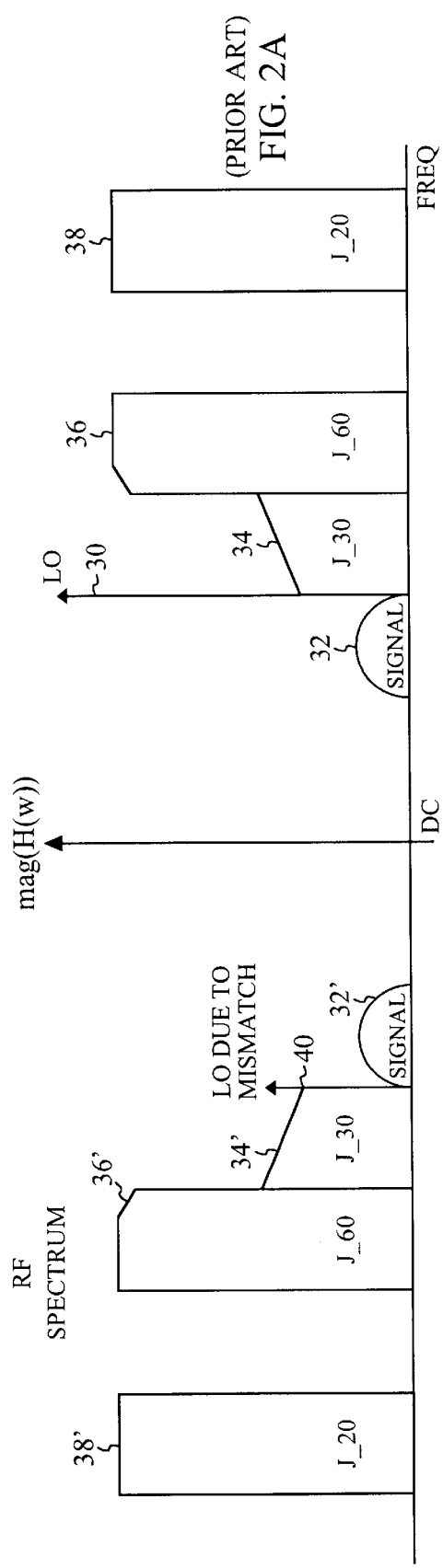
FIG. 2A is the RF spectrum of a circuit, such as illustrated in FIG. 1.

The image rejection ratio may be characterized by equation 1 below:

$$IRR = RSB + ACR (dB) \quad (1)$$

where IRR is the image rejection ratio, RSB is the ratio of the power of the local oscillator (i.e., the local oscillator 30 in FIG. 2A) compared with the amount of residual the level of the local oscillator due to mismatch, represented by the line 40 in the RF spectrum of FIG. 2A and ACR is the alternate channel rejection achieved by low-pass filtering The value ACR may be mathematically determined by the following:

$$ACR = -10 \log \left[ \sum_{n=-\infty}^{\infty} (A\_dig_n * A\_alias_n * J_n)^2 \right] - \left( \frac{C}{N_0} \right) (dB) \quad (2)$$

where the subscript n is the frequency index, which may be incremented in 400 Hz steps, per the sinusoidal modulation of the jammer (n=0 at the jammer's carrier frequency), $C/N_0$ is the C/N for 12 dB SINAD, 3.5 dB, J is the Bessel function, which is an intrinsic property of amplitude weighting in the spectrum of a sinusoidally frequency modulated carrier, A gives the attenuation of each filter (both digital filters and anti-alias filters) at the indexed frequency, relative to the insertion loss.

It should be noted that equations (1) and (2) can be generalized to apply to adjacent channel rejection as well as alternate channel rejection. Those skilled in the art will appreciate that in certain wireless communication system implementations, the center frequency of channels are spaced apart at every 30 kHz. Thus, an adjacent channel is 30 kHz from the desired signal channel while an alternate channel is 60 kHz apart from the desired signal channel. The adjacent and alternate channel rejection both involve filtering (to get ACR). However, adjacent channel rejection is always worse since the jammer is closer to the signal (i.e., 30 kHz vs. 60 kHz) and the filter is not sharp enough to attenuate it as much as it does the alternate channel jammer.

If equations (1) and (2) are applied to alternate channel rejection, the value IRR in equation (1) refers to the amount of energy of the desired signal at baseband (i.e., the strength of the portion 36$i$ of the spectrum in FIG. 2B) divided by the energy of the image portion 32' of the 60 kHz jammer. Equation (2) illustrates the calculation of a value for alternate channel rejection and takes into account the filtering effect of both digital and analog filtering. If equations (1) and (2) are applied to adjacent channel rejection, the value of IRR refers to the amount of energy of the desired signal at baseband (i.e., the portion 32' of the spectrum compared to the amount of energy from the portion 34$i$ of the 30 kHz image. When applied to adjacent channel rejection, the value ACR refers to adjacent channel rejection and may be characterized by equation (2).

Figure 4:
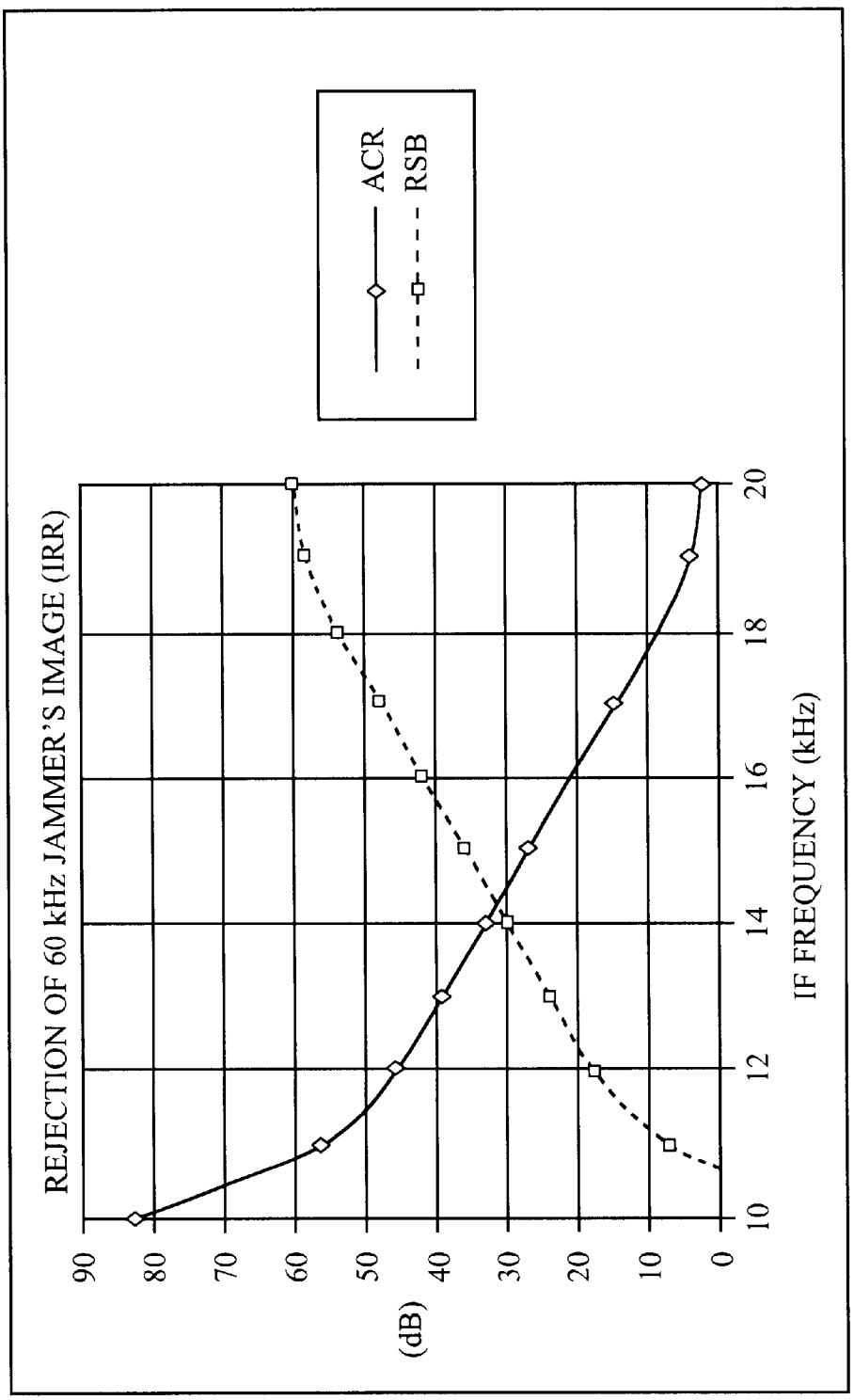
FIG. 4 is a graph illustrating image rejection techniques implemented by the system of FIG. 3.

For satisfactory operation of the system 100, the IRR should have a minimum value of 60 dB and the RSB (e.g., the LO signal due to mismatch, illustrated by the line 40 in the spectrum of FIG. 2A) may desirably be less than 30 dB. The chart of FIG. 4 illustrates the trade off between ACR and RSB for IRR=60 dB. As can be seen from FIG. 4, the lower the IF frequency, the greater the ACR rejection since the image of the jammer is further offset from the desired signal at baseband. As can be seen, the selection of a 15 kHz low IF allows the twin goals of the 60 dB IRR and a reasonable RFR6000 RSB (<40 dB corrected) to both be achieved.

In the example discussed herein, the IF is selected to be 15 kHz. Based on this selected IF, the image of the alternate channel jammer lands at 60−2*IF=30 kHz (30 kHz away from the 15 kHz low-IF). The adjacent channel jammer image lands at 30−2*IF=0 Hz (0 Hz from the signal). Since the ACR contributes to IRR only after the image is generated, the adjacent channel ACR is 0 since the offset is 0 Hz. Thus, with the IF selected for this example (i.e., 15 kHz), the ACR is applicable to alternate channel rejection only.

Figure 2B:
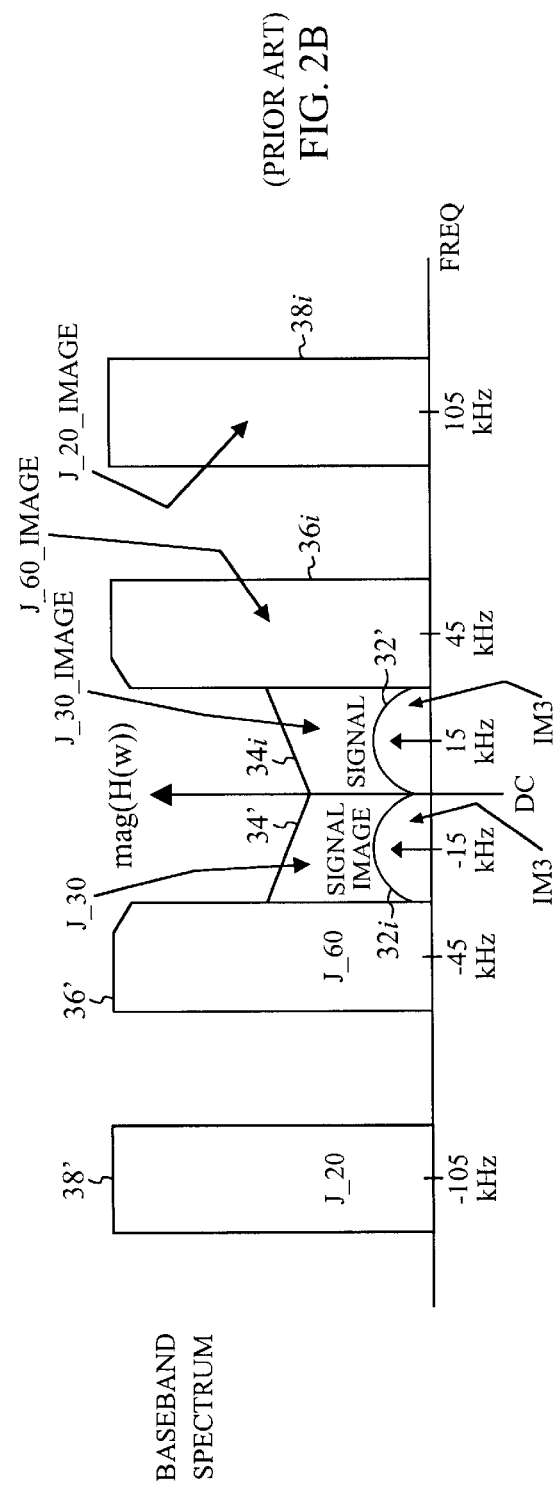
FIG. 2B is a baseband spectrum following demodulation by a circuit, such as the circuit of FIG. 1.

Another potential source of interference is intermodulation (IM) interference between the 60 kHz and the 120 kHz jammer. FIG. 2A illustrates the negative frequency components of the real input spectrum. The jammers are at −45 kHz and −105 kHz after down-conversion as they are still 60 kHz offset from the signal, which is at +15 kHz. The resulting third order intermodulation distortion (sometimes referred to IM3), is at 2*(−45)−(105)=+15 kHz. In the absence of the mismatch local oscillator 40, the IM3 distortion would occur at 60 kHz and 120 kHz from the desired signal. In FIG. 2B, the portions 36' and 38' of the spectrum are, in fact, spaced apart from the desired signal by 60 kHz and 120 kHz respectively.

In the presence of the mismatch local oscillator 40, the image portions of the spectrum 36$i$ and 38$i$ are no longer spaced 60 and 120 kHz apart from the desired signal. As illustrated in FIG. 2B, the image portions 36$i$ and 38$i$ of the spectrum are centered at 45 kHz and 105 kHz, which is a decreased offset from the desired signal. As a result, the desirable effects of the low-pass filter, such as the low-pass filters 128, the digital filter 136, or the digital filter 160, is degraded. Although it is possible to provide more sophisticated filters, such filters consume significant circuit space and are quite complex in design. Accordingly, the present invention provides compensation for the I-Q mismatch which eliminates the necessity of higher order filters.

Those skilled in the art will appreciate that a lower IF would cause increased distortion due to the DC notch (approximately 1 kHz wide). The location of the poles and channel filter mask were chosen to meet voice distortion and data bit error rate (BER) requirements.

The effects of the 60 kHz jammer and its image are discussed above. In addition, adjacent channel signal, which is the 30 kHz jammer, results in an in band image illustrated in the baseband spectrum of FIG. 2B. The J_30 image lands directly on top of the desired signal and thus cannot be filtered. This undesirable 30 kHz jammer signal must be rejected by proper matching of the I and Q channels. The IS-98B specification requires a minimum 16 dB. Thus, RSB must be at least 16+(C/N$_0$)=19.5 dB given the value for C/N$_0$ described above.

Figure 5:
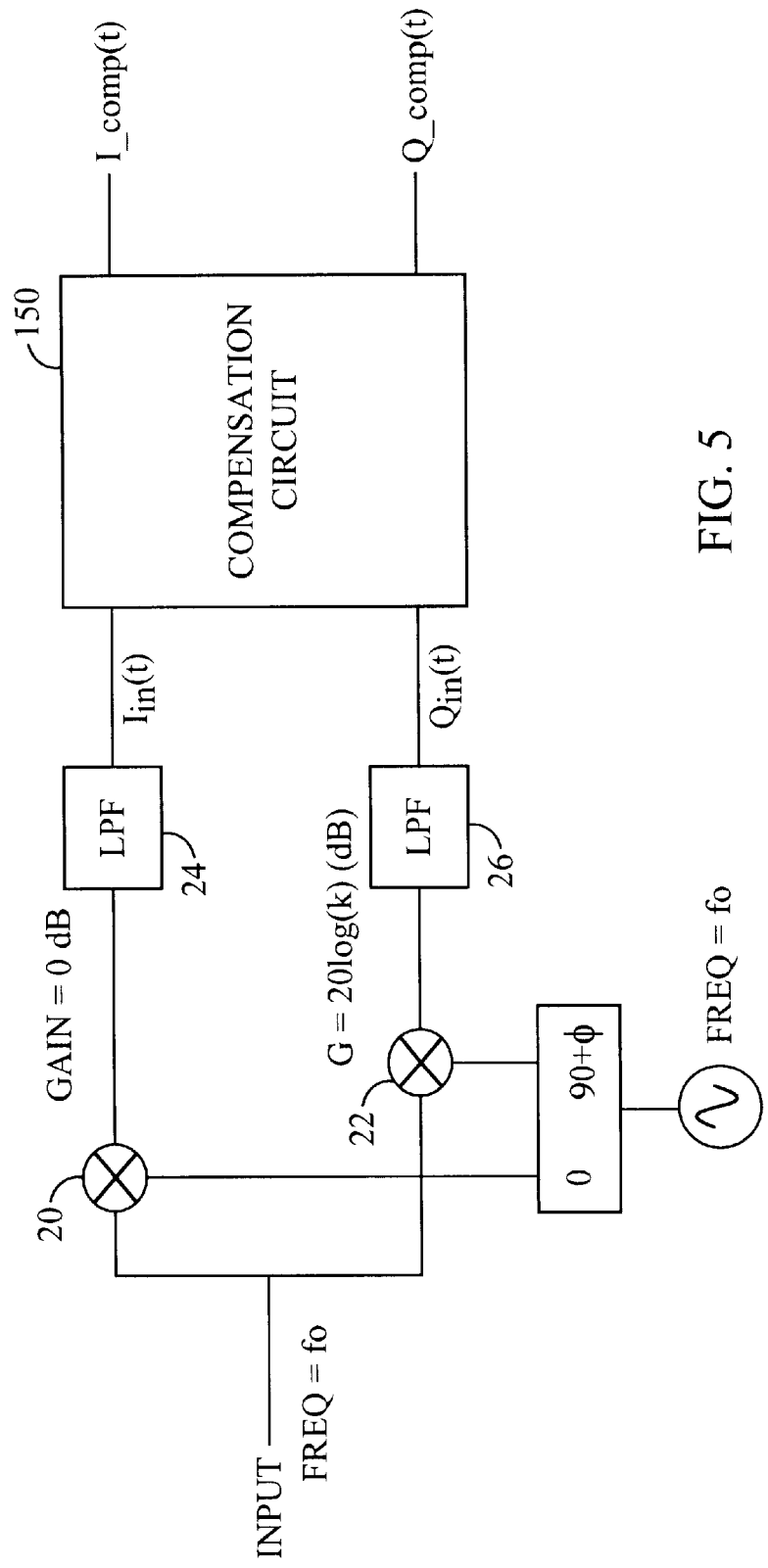
FIG. 5 is a functional block diagram illustrating the calibration techniques used by the system of the present invention.

As discussed above, the IC 130 can achieve about 20 dB RSB with appropriate system design. An additional 12 dB improvement in RSB must be provided by additional compensation circuitry. FIG. 5 illustrates an implementation of the compensation circuit 150 to provide the additional 12 dB of RSB. It should be noted that the circuit of FIG. 3 illustrates a digital implementation of the system 100. That is, the compensation circuit 150 is a digital compensation circuit. However, the present invention may be implemented in either digital form or analog form. FIG. 5 illustrates an analog implementation of the system 100 wherein the compensation circuit 150 follows the low-pass filters 24 and 26.

The mixer (e.g., the mixer 120 in FIG. 3), low pass filters (e.g., the filter 120$a$) and ADC (e.g., the ADC 134) all contribute to mismatch in the I and Q circuits. These result in possible phase error and/or gain error between I and Q. To understand the signal processing by the mixers, let □ denote quadrature error, and let k denote gain error between I and Q. For the sake of mathematical analysis, consider that all of the error is lumped into the Q channel (i.e., the I channel is considered to be an accurate signal). The I and Q mixers in FIG. 5 may be conventional mixers, such as the mixers 20 and 22, respectively, discussed above with respect to FIG. 1. The input signals for I and Q are characterized by the following:

$$I_{in} = \cos(f(t))$$

$$Q_{in} = k \sin(f(t)+\phi) = k \cos\phi \sin(f(t)) + k \sin\phi \cos(f(t)) \quad (3)$$

where $I_{in}$ and $Q_{in}$ represent the input signals to the compensation circuit 150. From equation (3), it follows that the I and Q signals may be corrected to eliminate the phase and gain errors. The correction factors that are applied to Iin and Qin are shown in matrix from in equation (4) below:

$$[I \ Q]_{compensated} = [I \ Q]_{in} \begin{bmatrix} 1 & -\tan\phi \\ 0 & \frac{1}{k\cos\phi} \end{bmatrix} \quad (4)$$

where the correction factors of equation (4) result in perfect correction of the I and Q signals.

In the implementation of the system 100 shown in FIG. 3, the signal $I_{in}$ and $Q_{in}$ are digital signals. Thus, the correction factors in equation (4) above may be implemented as digital signals that increase and decrease in a step-wise fashion based on the number of bits provided in a correction factor and a voltage range of the correction factor. In an actual implementation of a compensation system, the perfect correction example provided by equation (4) may be substituted by actual correction factors illustrated in equation (5) below:

$$[I \ Q]_{compensated} = [I \ Q]_{in} \begin{bmatrix} 1 & -\tan\theta \\ 0 & \frac{1}{\alpha\cos\theta} \end{bmatrix} \quad (5)$$

where $\theta \neq \square$ and $\alpha \neq k$. The number of bits required for the signals to provide acceptable compensation in view of quantization error are discussed below.

Figure 6:
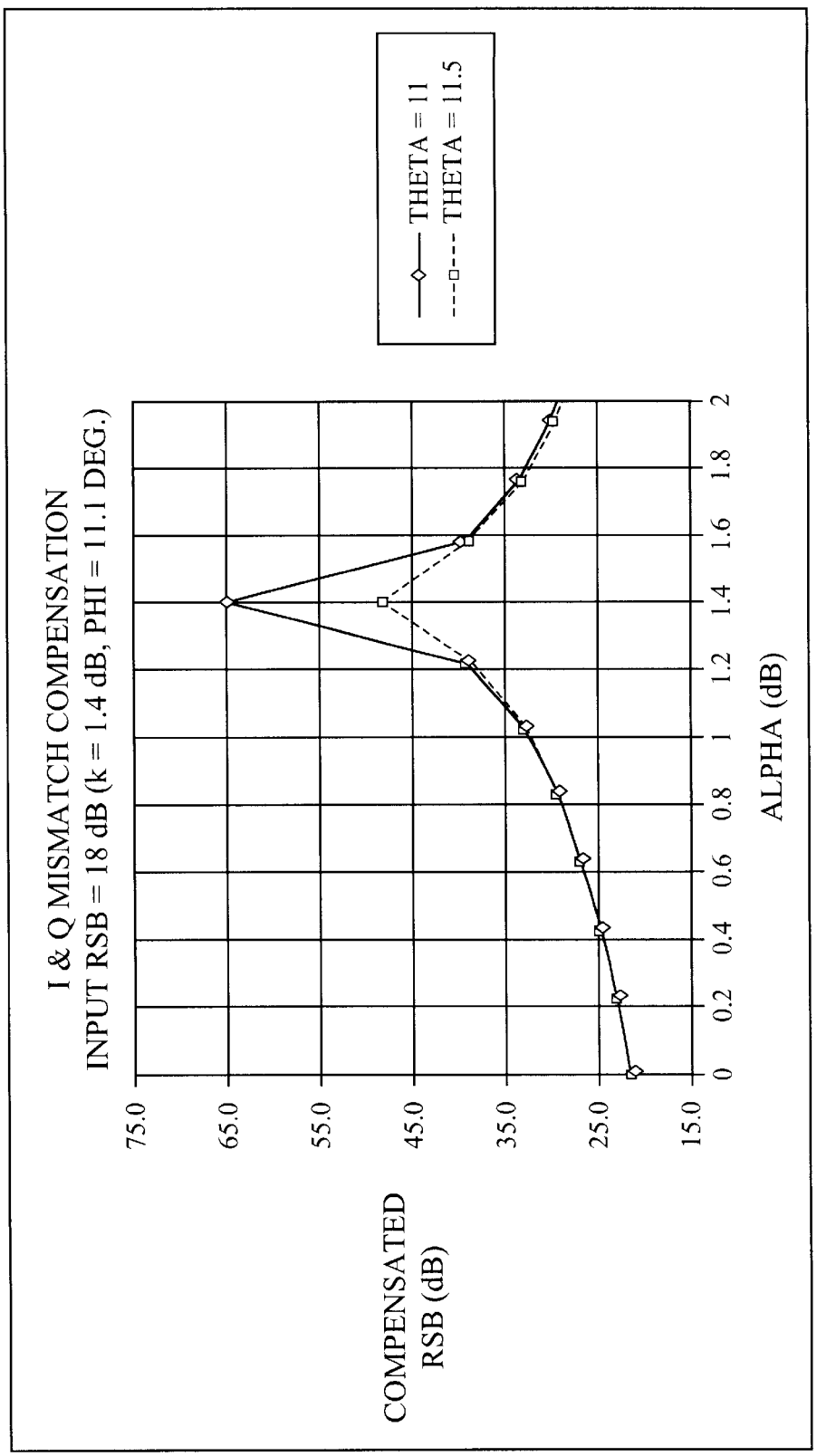
FIG. 6 is a graph illustrating compensation for gain and phase errors by the system of the present invention.
Figure 7:
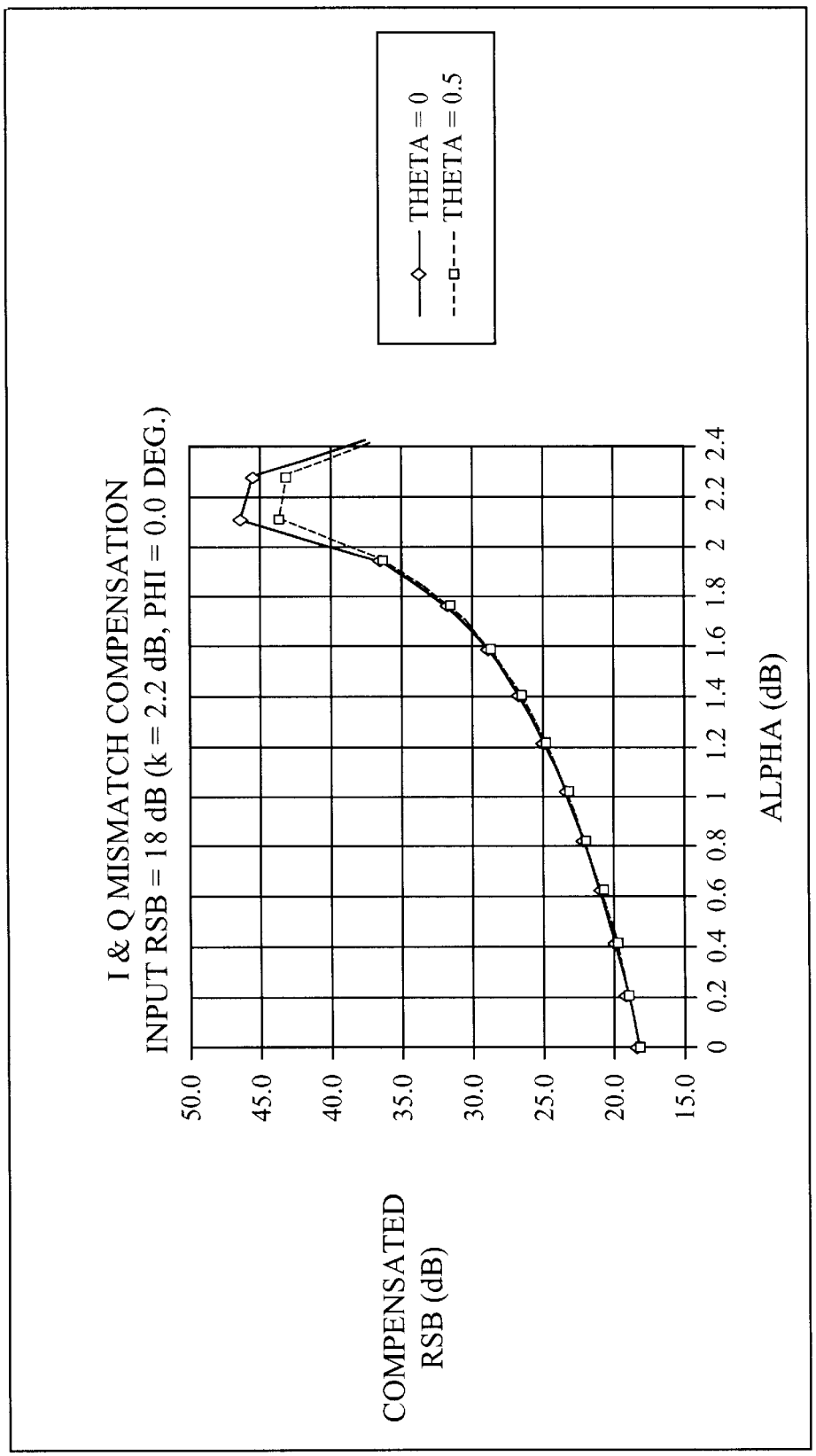
FIG. 7 is a graph illustrating compensation for gain error by the system of the present invention.
Figure 8:
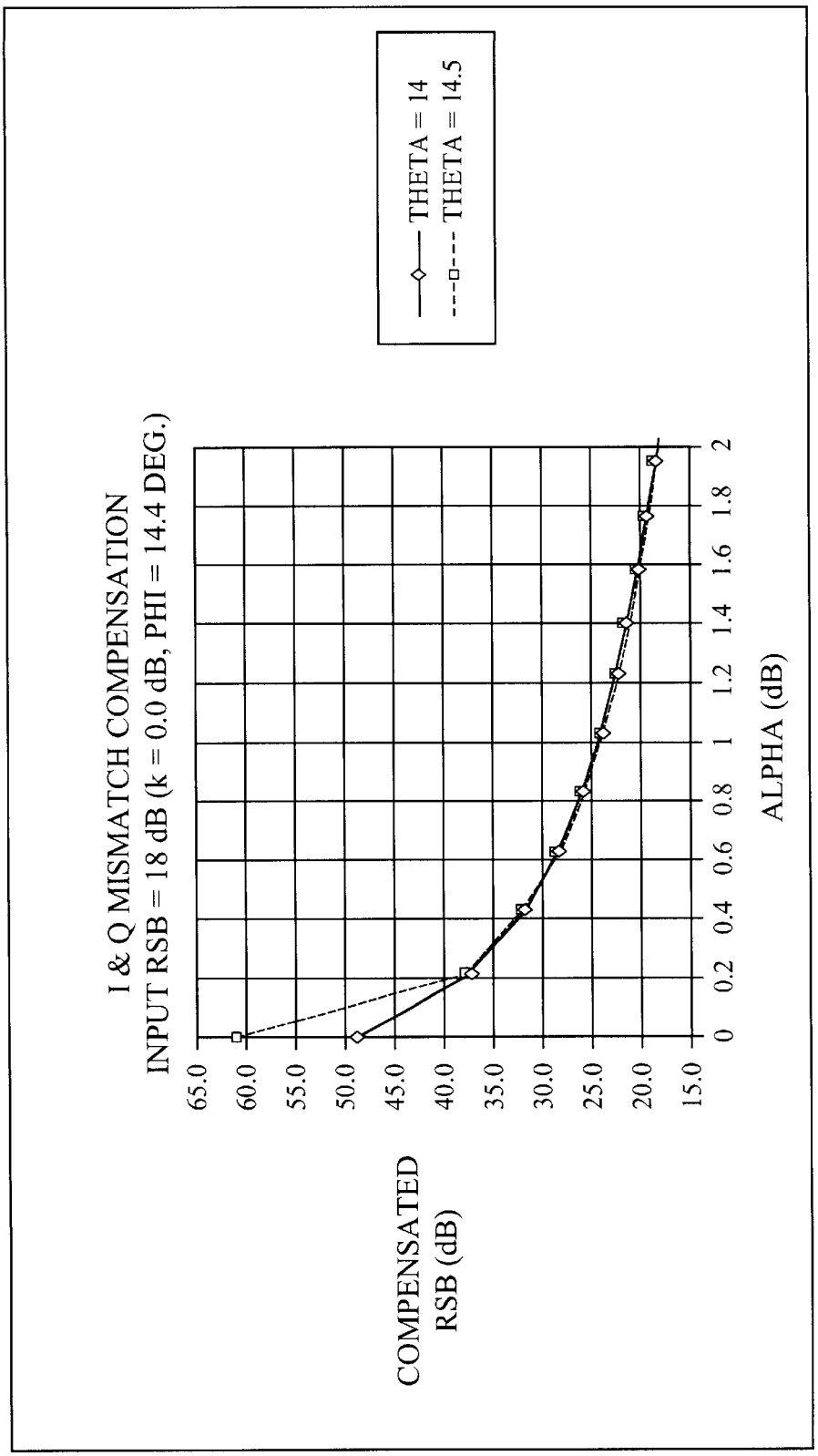
FIG. 8 is a graph illustrating the correction of phase error by the system of the present invention.

The effects of quantization error are illustrated in the graphs of FIGS. 6–8. In FIG. 6, perfect correction values result when k=1.4 db and $\phi$=11.1°. The graphs of FIG. 6 illustrate changes in the compensation RSB for variations in $\alpha$ and $\theta$ that result from quantization error.

Similarly, FIGS. 7 and 8 illustrate the variation in compensated RSB for different values of k and $\phi$. Those skilled in the art will recognize that it is desirable to minimize the quantization error in order to accurately represent the compensation values in the compensation matrix of FIG. 5.

The derivation of the compensated signals are shown below where equation (6) below is a mathematical representation of the signal generated at the output of the IC 130 (see FIG. 3) and illustrates the calculation of RSB in terms of signal amplitudes:

$$\text{Signal} = I + jQ = Ae^{jf(t)} + Be^{-jf(t)}$$

$$RSB = 20\log\left(\frac{|A|}{|B|}\right) \quad (6)$$

where A and B represent the amplitude of the quadrature components. The amplitudes A and B may be represented using the terms of equations (4) and (5) above resulting in equation (7) below:

$$A = \frac{1}{2}\left\{1 + \frac{k}{\alpha}\left(\frac{\cos\phi}{\cos\theta}\right) + j\left[\frac{k}{\alpha}\left(\frac{\sin\phi}{\sin\theta}\right) - \tan\theta\right]\right\} \quad (7)$$

$$B = \frac{1}{2}\left\{1 - \frac{k}{\alpha}\left(\frac{\cos\phi}{\cos\theta}\right) + j\left[\frac{k}{\alpha}\left(\frac{\sin\phi}{\sin\theta}\right) - \tan\theta\right]\right\}$$

where all terms have been previously defined. Combining equations (6) and (7) above results in a calculation of the compensated RSB and is given by the following:

$$RSB_{compensated} = 10\log\left[\frac{\left(\frac{\cos\phi}{\cos\theta} + \frac{\alpha}{k}\right)^2 + \left(\frac{\sin\phi}{\cos\theta} - \frac{\alpha}{k}\tan\theta\right)^2}{\left(\frac{\cos\phi}{\cos\theta} - \frac{\alpha}{k}\right)^2 + \left(\frac{\sin\phi}{\cos\theta} - \frac{\alpha}{k}\tan\theta\right)^2}\right] \quad (8)$$

where terms have been previously defined.

$$rsb^2 = 10^{\frac{RSB}{10}} \quad (9)$$

The compensation matrix of equation (5) provides a digital implementation in which the correction values of the matrix are determined for each wireless communication device and are stored within the wireless communication device. A range of values for the correction parameters and the desired resolution of the correction parameters have been experimentally determined and are illustrated below in Table 1.

TABLE 1

| Parameter | Range | Resolution | Bitwidth |
|---|---|---|---|
| $\alpha$ | 1.000–1.303 (V/V) | 0.025 (V/V) | NA |
| $\theta$ | 0 to 15 degrees | 0.5 degrees | NA |
| E(1,2) | 0 to −0.268 | 0.00837 | 5 |
| E(2,2) | 0.7675–1.0353 | 0.0000327 | 13 |

As previously noted, statistical uncertainties in the fabrication process of the IC 130 (see FIG. 3) and in the fabrication of other circuit components lead to the problem of the mismatched local oscillator 40 (see FIG. 2A). Thus, the error is unpredictable from one wireless communication device to another. Accordingly, it is not possible to derive a single correction matrix which may be uniformly implemented across a variety of wireless communication devices. Therefore, each wireless communication device is tested at final assembly and the values for the correct matrix of FIG. 5 are determined and stored within a memory, such as the NV (non-volatile) memory of the wireless communication device.

In one embodiment, a pure tone RF signal may be injected into the wireless communication device to determine the gain and phase errors caused by circuit mismatch. With reference to FIG. 3, if there were no circuit mismatch, the I/Q outputs of the IC 130 would be precisely matched and no spectral image would be present, however, in actual application, the I/Q circuits have some degree of mismatch, resulting in a spectra similar to that illustrated in FIG. 2B. A digital signal processor (DSP) within the wireless communication device may be used to perform the calculations illustrated herein to determine the values for the compensation matrix. Alternatively, external circuitry, such as an external DSP, microprocessor, or the like may be used to solve the mathematical equations described above to determine the values of the compensation matrix of equation (5). When the values for the compensation matrix of equation (5) have been determined, data indicative of those values are stored within the wireless communication device and are applied to the I/Q signals to provide compensated versions thereof.

In a narrow bandwidth system (such as GSM), a single frequency signal may be used to calibrate the receiver portion of the wireless communication device and permit the calculation of compensation factors by which the I and Q signals may be compensated. A suitable test apparatus is illustrated in the functional block diagram of FIG. 9 where a signal generator 164 generates an RF signal at a single frequency. This is sometimes referred to as continuous wave (CW) modulation. The RF signal is coupled to a wireless communication device 168, which contains many of the components described above with respect to FIG. 3.

Figure 9:
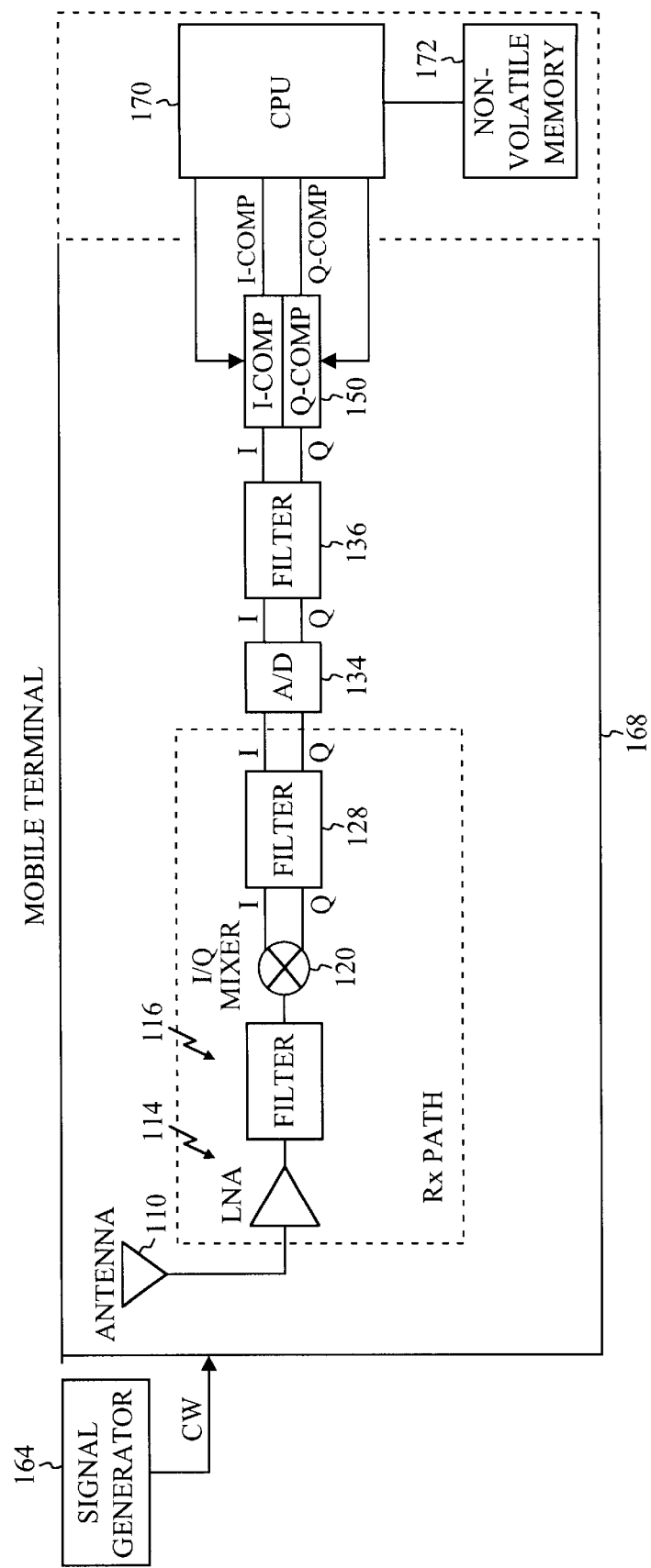
FIG. 9 is a functional block diagram illustrating a test setup for calibration of a wireless communication device using the present techniques.

Also illustrated in FIG. 9 is a CPU 170 and a nonvolatile memory 172. These components are illustrated in dashed lines since the CPU and memory may be part of the wireless communication device 168. Alternatively, either the CPU 170 or the nonvolatile memory 172 may be an external component used in a factory assembly and test process. The system 100 is not limited by the physical location of the CPU 170 and the memory 172. It should be noted that the CPU 170 may be implemented by a number of different known devices. If implemented within the wireless communication device, the CPU 170 may be a conventional processor or a digital signal processor (DSP). An external implementation of the CPU 170 may include a conventional personal computer (PC) workstation, DSP, or the like.

Those skilled in the art will recognize that other computing devices, such as a microprocessor, microcontroller, or the like may be used to implement the CPU 170. Similarly, the memory 172 may be implemented using a variety of known technologies. For example, although the memory 172 is illustrated as a nonvolatile memory, the memory may be implemented using conventional computer memory such as DRAM, SRAM, or other known memory technologies. The present invention is not limited by the specific implementation of the memory 172.

Using the CW signal from the signal generator 164, the CPU 170 measures the time delay between the I and Q output signals at a zero crossing and calculates the corresponding phase offset from quadrature to determine the phase error. The ratio of the RMS voltages of the I and Q signals can be measured by the CPU to determine the gain error. The measured phase and gain errors may be substituted into equation 3 and the equations solved by the CPU 170 to determine the compensation factors for the specific wireless unit 168. The correction factors of equation 5 are stored in a nonvolatile memory within the wireless unit 168. Those compensation factors are used by the compensation circuit 150 to generate the compensated output signals.

In narrow-band wireless systems, such as a GSM system, a single frequency generated by the signal generator 164 will suffice using the techniques described above. However, for spectrum technologies, such as CDMA, a single frequency calibration process may be inadequate. Furthermore, CDMA receivers use higher data rates. This necessitates higher carrier-to-noise (C:N) ratios in the receiver to maintain the data throughput. One of the factors that degrades CDMA C:N ratio is RSB. The method of calibration described herein will facilitate RSB values greater than 30 dB. Accordingly, if the wireless unit 168 is a CDMA unit, the signal generator 164 sequentially generates CW signals at a plurality of different frequencies representative of CDMA bandwidth. In an exemplary embodiment, three CW tones are used to calibrate a CDMA receiver for RSB. At each of the frequencies, the phase error and gain error may be calculated in the manner described above. The gain and phase errors may be averaged for each of the plurality of frequencies and used to compute composite correction factors. Instead of trying to measure the CDMA image in a zero-IF receiver, which is very difficult, the problem reduces to applying 2 or 3 CW tones and measuring the resultant I and Q waveforms as described above.

As noted above, the computations are performed by the CPU 170, which may be part of the CDMA wireless communication device 168 or an external computational device. The correction factors are stored in a nonvolatile memory within the wireless communication device 168 and used by the compensation circuit 150 in the manner described above. Thus, the test assembly of FIG. 9 may be readily adapted to calibrate individual wireless communication devices.

The compensation process for IQ mismatch has been described with respect to certain receiver types. However, those skilled in the art will recognize that the principles of the present invention may be applied in accordance with other standards, such as radio receivers, analog and digital cell phones and the like. Thus, the present invention is not to be limited except by the appended claims.

What is claimed is:

1. An apparatus for compensation of I-Q mismatch in a low IF or zero IF receiver, comprising:

first and second mixers each having a radio frequency (RF) input, a local oscillator input and a mixer output, the RE inputs of the mixers being configured to receive modulated RE signals, the local oscillator input of the first mixer being configured to receive an I local oscillator signal and the local oscillator input of the second mixer being configured to receive a Q local oscillator signal having a frequency substantially equal to a frequency of the I local oscillator signal;

first and second filters coupled to the mixer outputs of the first and secpnd mixers, respectively, to filter output signals from the mixer outputs to thereby generate I and Q output signals, respectively, wherein the first and second mixers and/or first and second filters have gain and/or phase errors that result in mismatch in the I and Q output signals; and a correction circuit to automatically apply a correction factor to at least one of the I and Q output signals to correct the gain and/or phase error by applying a multiplication factor to the at least one of the I and Q output signals to thereby generate a corrected signal, the correction factor being derived from gain and/or phase error measurements at a plurality of different RF frequencies.

2. The apparatus of claim 1 wherein the correction circuit applies multiplication factors to both the I and Q output signals to thereby generate a corrected I output signal and a corrected Q output signal.

3. The apparatus of claim 1 wherein the correction circuit is coupled to the first and second filter outputs and receives the I and Q output signals therefrom as analog signals.

4. The apparatus of claim 3 wherein the correction circuit generates and applies an analog correction factor to at least one of the I and Q output signals.

5. The apparatus of claim 1, further comprising an analog to digital converter (ADC) to convert the I and Q output signals to digital I and Q output signals, the correction circuit applying the correction factor to the at least one of the I and Q digital output signals.

6. The apparatus of claim 5 wherein the correction factor is a digital correction factor.

7. The apparatus of claim 1 wherein the receiver is a portion of a wireless communication device, the system further comprising a storage area to store data indicative of the correction factor.

8. The apparatus of claim 1, further a test signal generation circuit to generate multiple fixed frequency signals as inputs to the first and second mixers to permit test measurement of gain and/or phase errors the phase and gain errors are measured for each frequency offset and avenged to produce the correction factors.

9. The apparatus of claim 8 wherein the correction factor applied by the correction circuit is based on the test measurement.

10. The apparatus of claim 9 wherein the receiver is a portion of a wireless communication device, the system further comprising a storage area to store data indicative of the correction factor.

11. An apparatus for compensation of circuit mismatch in a low IF or zero IF receiver, comprising:
  mixer means for mixing modulated radio frequency (RE) signals from RF to baseband or near-baseband;
  filter means coupled to an output of the mixer means for filtering signals genetated by the mixer means
  wherein the mixer means and/or the filter means have gain and/or phase error that result in undesired signal components in an output signal of the filter means; and
  compensation means for automatically applying a correction factor to the output signal of the filter means by applying a multiplication factor to the output signal to thereby generate a corrected signal,
  wherein the apparatus for compensation of circuit mismatch is implemented in a quadrature receiver, the mixer means comprising:
  first mixer means having a radio frequency (RF) input, a local oscillator input and a mixer output, the RF inputs of the first mixer means being configured to receive modulated RF signals, the local oscillator input of the first mixer means being configured to receive an I local oscillator signal; and
  second mixer means having a radio frequency (RF) input, a local oscillator input and a mixer output, the RF inputs of the second mixer means being configured to receive modulated RE signals, the local oscillator input of the second mixer means being configured to receive a Q local oscillator signal having a frequency substantially equal to a frequency of the I local oscillator signal.

12. The apparatus of claim 11 wherein the apparatus for compensation of circuit mismatch is implemented in a quadrature receiver, the filter means comprising:
  first filter means coupled to the output of the first mixer means for filtering output signals from the first mixer means to thereby generate an I output signal;
  second filter means coupled to the output of the second mixer means for filtering output signals from the second mixer means to thereby generate a Q output signal.

13. The apparatus of claim 12 wherein the apparatus for compensation of circuit mismatch is implemented in a quadrature receiver wherein the compensation means automatically applies a correction factor to at least one of the I and Q output signals to correct the gain and/or phase error by applying a multiplication factor to the at least one of the I and Q output signals to thereby generate a corrected signal.

14. The apparatus of claim 13 wherein the compensation means applies multiplication factors to both the I and Q output signals to thereby generate a corrected I output signal and a corrected Q output signal.

15. The apparatus of claim 11 wherein the compensation means generates the compensation factor as an analog signal.

16. The apparatus of claim 11, further comprising an analog to digital converter (ADC) to convert the output signal of the filter means to digital output signals, the compensation means applying the correction factor to the digital output signal.

17. The apparatus of claim 16 wherein the compensation means generates the compensation factor as a digital signal.

18. The apparatus of claim 11 wherein the receiver is a portion of a wireless communication device, the apparatus further comprising storage means for storing data indicative of the correction factor.

19. The apparatus of claim 11, further comprising test signal generation means for generating a fixed frequency signal as an inputs to the mixer means to permit test measurement of gain and/or phase errors.

20. The apparatus of claim 19 wherein the correction factor applied by the correction circuit is based on the test measurement.

21. A method for compensation of I-Q mismatch in a low IF or zero IF CDMA receiver, comprising:
  injecting a plurality of radio frequency (RF) signals of different frequencies into RF inputs of first and second mixers;
  injecting an I local oscillator signal into a local oscillator input of the first mixer;
  injecting a Q local oscillator signal into a local oscillator input of the second mixer;
  for each of the plurality of RF signals, coupling outputs of the first and second mixers to filter inputs, respectively, of first and second filters;
  for each of the plurality of RF signals, measuring gain and/or phase errors in filter output signals of at least one of the first and second filters; and
  determining a correction factor to apply to at least one of the filter output signals to correct the gain and/or phase error.

22. The method of claim 21 wherein determining the correction factor comprises determining correction factors for both the filter output signals to correct the gain and/or phase error.

23. The method of claim 21 wherein the correction factor is an analog signal.

24. The method of claim 21 wherein the correction factor is a digital number, quantized to a resolution commensurate with the desired image rejection ratio.

25. The method of claim 21 wherein the receiver is a portion of a wireless communication device, the method further storing data indicative of the correction factor.

26. The method of claim 21 wherein injecting the RF signal comprises injecting a fixed frequency signal or multiple fixed frequency signals modulated to the RF.

27. A computer-readable media for compensation of I-Q mismatch in a low IF or zero IF CDMA receiver by instructing a computer system to:
  inject a plurality of radio frequency (RF) signals of different frequencies into RF inputs of first and second mixers;
  inject an I local oscillator signal into a local oscillator input of the first mixer,
  inject a Q local oscillator signal into a local oscillator input of the second mixer;
  for each of the plurality of RF signals coupled from outputs of the first and second mixers to filter inputs, respectively, of first and second filters, measure gain and/or phase errors between filter output signals; and
  determine a correction factor to apply to at least one of the filter output signals to correct the gain and/or phase error.

28. The computer-readable media of claim 27 wherein the instructions to cause the computer system to determine the correction factor comprises determining correction factors for both the filter output signals to correct the gain and/or phase error.

29. The computer-readable media of claim 27 wherein the correction factor is a digital number, the instructions to cause the computer system to quantize the correction factor to a resolution commensurate with the desired image rejection ratio.

30. The computer-readable media of claim 27 wherein the receiver is a portion of a wireless communication device and the instructions to cause the computer system to store data indicative of the correction factor within the wireless communication device.

31. The computer-readable media of claim 27 wherein the instructions to cause the computer system to inject the RF signal comprises injecting a fixed frequency signal or multiple fixed frequency signals modulated to the RF.

* * * * *